(12) United States Patent
Yang et al.

(10) Patent No.: US 12,543,435 B2
(45) Date of Patent: Feb. 3, 2026

(54) OLED DISPLAY PANEL AND OLED DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Lin Yang, Hubei (CN); Wei Zou, Hubei (CN)

(73) Assignee: Wuhan China Star Optoelectronics Semiconductor Display Technology Co., Ltd., Hubei (CN)

(*) Notice: Subject to any disclaimer, the term of this patent is extended or adjusted under 35 U.S.C. 154(b) by 1037 days.

(21) Appl. No.: 17/292,464

(22) PCT Filed: Mar. 30, 2021

(86) PCT No.: PCT/CN2021/084101
§ 371 (c)(1),
(2) Date: May 10, 2021

(87) PCT Pub. No.: WO2022/193365
PCT Pub. Date: Sep. 22, 2022

(65) Prior Publication Data
US 2022/0359625 A1 Nov. 10, 2022

(51) Int. Cl.
H10K 59/121 (2023.01)
H10K 59/122 (2023.01)
H10K 59/80 (2023.01)
H10K 59/65 (2023.01)

(52) U.S. Cl.
CPC ........ *H10K 59/121* (2023.02); *H10K 59/122* (2023.02); *H10K 59/80515* (2023.02); *H10K 59/80518* (2023.02); *H10K 59/878* (2023.02); *H10K 59/65* (2023.02)

(58) Field of Classification Search
None
See application file for complete search history.

(56) References Cited

U.S. PATENT DOCUMENTS

2019/0103442 A1   4/2019   Choi et al.
2021/0066415 A1   3/2021   Lee et al.

FOREIGN PATENT DOCUMENTS

| CN | 102386338 A | 3/2012 |
|---|---|---|
| CN | 104241535 A | 12/2014 |
| CN | 104282844 A | 1/2015 |
| CN | 104914632 A | 9/2015 |
| CN | 107170904 A | 9/2017 |
| CN | 108110038 A | 6/2018 |
| CN | 109786578 A | 5/2019 |
| CN | 111029386 A | 4/2020 |
| CN | 111146362 A | 5/2020 |

(Continued)

*Primary Examiner* — Jack S Chen
(74) *Attorney, Agent, or Firm* — Rivka Friedman

(57) ABSTRACT

An organic light-emitting diode (OLED) display panel and an OLED display device are provided. A length of a second anode of a second display area extended from a second pixel opening is greater than that of a first anode in a first display area extended from a first pixel opening. Light can be reflected to outside of the display panel through a portion of the second anode extended from the second pixel opening, so that brightness of the second display area is similar or consistent with brightness of the first display area.

20 Claims, 13 Drawing Sheets

(56) References Cited

FOREIGN PATENT DOCUMENTS

| | | | |
|---|---|---|---|
| CN | 111341936 | A | 6/2020 |
| CN | 112072000 | A | 12/2020 |
| CN | 112864211 | A | 5/2021 |
| KR | 20190037603 | A | 4/2019 |

OLED DISPLAY PANEL AND OLED DISPLAY DEVICE

BACKGROUND OF INVENTION

Field of Invention

The present invention relates to a display technology, and more particularly, to an organic light-emitting diode (OLED) display panel and an OLED display device.

Description of Prior Art

Currently, display devices include liquid crystal display devices, plasma display devices, organic light-emitting diode (OLED) devices, etc. OLED display devices are widely used because they do not require a backlight. In order to achieve a full screen, a camera is disposed under a display panel in conventional OLED display devices, so that when a camera function is realized, a display function is turned off. When the display function is realized, a camera area under the screen displays, that is, camera under panel (CUP) technology. At the same time, in order to realize thinner and lighter display devices, the display devices adopt direct on cell touch (DOT), directly fabricating a touch layer on a packaging layer. In the DOT design, a light-shielding metal grid is required to form traces of the touch layer. In the prior art, in order to improve light transmittance of the camera area under the screen, metal grids are not disposed in the camera area under the screen, and the metal grids are merely disposed in a display area. However, in the display area, the metal grids affect the display area. The large viewing angle of the camera is blocked, which causes display brightness of the display area to be less than display brightness of the camera area under the screen, resulting in poor display effect.

Therefore, there is a technical problem in the conventional display devices that the touch metal mesh blocks the light, which causes the display brightness of the display area and the under-screen camera area to be inconsistent.

SUMMARY OF INVENTION

An organic light-emitting diode (OLED) display panel and an OLED display device are provided, which solve a technical problem in the conventional display devices that the touch metal mesh blocks the light that causes the display brightness of the display area and the under-screen camera area to be inconsistent.

An organic light-emitting diode (OLED) display panel comprises a first display area and a second display area. The OLED display panel comprises:
  a substrate;
  a driving circuit layer disposed on a side of the substrate;
  an anode layer disposed on a side of the driving circuit layer away from the substrate, and the anode layer comprises a plurality of first anodes located in the first display area and a plurality of second anodes located in the second display area;
  a pixel definition layer disposed on a side of the anode layer away from the driving circuit layer, and the pixel definition layer comprises a plurality of first pixel openings disposed corresponding to the first anode and a plurality of second pixel openings disposed corresponding to the second anode;
  a light-emitting function layer disposed on a side of the pixel definition layer away from the anode layer; and
  a packaging layer disposed on a side of the light-emitting function layer away from the pixel definition layer;
  a length of the second anode in the second display area extended from the second pixel opening is greater than a length of the first anode in the first display area extended from the first pixel opening.

In one embodiment, a minimum length of a portion of the second anode extended from the second pixel opening is greater than a maximum length of the first anode extended from the first pixel opening.

In one embodiment, an optical compensation structure is disposed on a side of the second anode away from the driving circuit layer, or the optical compensation structure is disposed on a side surface of the second anode facing the pixel definition layer.

In one embodiment, the optical compensation structure is disposed around the second pixel opening.

In one embodiment, the optical compensation structure comprises a saw-tooth structure, and the saw-tooth structure comprises a plurality of protrusions and grooves.

In one embodiment, adjacent saw teeth of the saw-tooth structure comprise acute angles.

In one embodiment, the OLED display panel comprises a touch layer, and the touch layer is disposed on a side of the packing layer away from the substrate; the touch layer comprises a touch electrode, the touch electrode comprises a touch metal, the touch metal is provided with a touch opening corresponding to the second pixel opening; the second display area comprises a first area corresponding to the touch metal and a second area corresponding to the touch opening; and the portion of the second anode extended from the second pixel opening is extended from the first area to the second area.

In one embodiment, the first display area is not provided with touch electrodes.

In one embodiment, when the optical compensation structure is disposed on the side surface of the second anode facing the pixel definition layer, a portion of the optical compensation structure extended from the second pixel opening is disposed in the first area, or the portion of the optical compensation structure extended from the second pixel opening extends from the first area to the second area.

In one embodiment, the OLED display panel further comprises a reflective layer, wherein the reflective layer is disposed on a side of the light-emitting function layer away from the anode layer, and the reflective layer is disposed around the second pixel opening.

In one embodiment, the OLED display panel further comprises a cathode layer, wherein the cathode layer is disposed on a side of the light-emitting function layer away from the pixel definition layer, and the reflective layer is disposed between the cathode layer and the pixel definition layer.

In one embodiment, a projection of the reflective layer on the substrate is not overlapped with a projection of the optical compensation structure on the substrate.

In one embodiment, a projection of the reflective layer on the substrate overlaps with a projection of the optical compensation structure on the substrate in the first area.

In one embodiment, a range of difference between a length of a portion of the second anode in the second display area extended from the second pixel opening and a length of a portion of the first anode in the first display area extended from the first pixel opening is from 8 µm to 12 µm.

An organic light-emitting diode (OLED) display device comprises an OLED display panel and electronic components. The OLED display panel comprises a first display area corresponding to the electronic components and a second display area, and the OLED display panel further comprises:

substrate;

a driving circuit layer disposed on a side of the substrate;

an anode layer disposed on a side of the driving circuit layer away from the substrate, and the anode layer comprises a plurality of first anodes located in the first display area and a plurality of second anodes located in the second display area;

a pixel definition layer disposed on a side of the anode layer away from the driving circuit layer, and the pixel definition layer comprises a plurality of first pixel openings disposed corresponding to the first anode and a plurality of second pixel openings disposed corresponding to the second anode;

a light-emitting function layer disposed on a side of the pixel definition layer away from the anode layer; and a packaging layer disposed on a side of the light-emitting function layer away from the pixel definition layer;

a length of the second anode in the second display area extended from the second pixel opening is greater than a length of the first anode in the first display area extended from the first pixel opening.

In one embodiment, a minimum length of a portion of the second anode extended from the second pixel opening is greater than a maximum length of the first anode extended from the first pixel opening.

In one embodiment, an optical compensation structure is disposed on a side of the second anode away from the driving circuit layer, or the optical compensation structure is disposed on a side surface of the second anode facing the pixel definition layer.

In one embodiment, the optical compensation structure is disposed around the second pixel opening.

In one embodiment, the optical compensation structure comprises a saw-tooth structure, and the saw-tooth structure comprises a plurality of protrusions and grooves.

In one embodiment, adjacent saw teeth of the saw-tooth structure comprise acute angles.

The present invention has beneficial effect as follows. The present invention provides an OLED display panel and an OLED display device. The OLED display panel comprises a first display area and a second display area. The OLED display panel comprises a substrate, a driving circuit layer, an anode layer, a pixel definition layer, a light-emitting function layer, and a packaging layer. The driving circuit layer is disposed on a side of the substrate, and the anode layer is disposed on a side of the driving circuit layer away from the substrate. The anode layer comprises a plurality of first anodes in the first display area and a plurality of second anodes in the second display area. The pixel definition layer is disposed on a side of the anode layer away from the driving circuit layer. The pixel definition layer comprises a plurality of first pixel openings disposed corresponding to the first anode, and a plurality of second pixel openings disposed corresponding to the second anode. The light-emitting function layer is disposed on a side of the pixel definition layer away from the anode layer. The packaging layer is disposed on a side of the light-emitting function layer away from the pixel definition layer, and a length of the second anode in the second display area extended from the second pixel opening is greater than a length of the first anode in the first display area extended from the first pixel opening. In the embodiment of the present invention, the length of the second anode in the second display area extended from the second pixel opening is greater than the length of the first anode in the first display area extended from the first pixel opening, thereby increasing the length of the second anode in the second display area. In the second display area, when light is emitted to the portion of the second anode extended from the second pixel opening, it can be reflected to the outside of the display panel through the portion of the second anode extended from the second pixel opening. In this way, the brightness of the second display area is similar to or consistent with the brightness of the first display area, thereby preventing inconsistent display brightness of the display area and the camera area under the screen.

BRIEF DESCRIPTION OF DRAWINGS

The technical solutions and other beneficial effects of the present invention will be made obvious by describing the specific implementation manners of the present invention in detail below in conjunction with the accompanying drawings.

DETAILED DESCRIPTION OF PREFERRED EMBODIMENTS

The technical solutions in the embodiments of the present invention will be clearly and completely described below in conjunction with the drawings in the embodiments of the present invention. Obviously, the described embodiments are only a part of the embodiments of the present invention, rather than all the embodiments. Based on the embodiments in this invention, all other embodiments obtained by those skilled in the art without creative work shall fall within the protection scope of this invention.

An organic light-emitting diode (OLED) display panel and an OLED display device are provided, which solve a technical problem in the conventional display devices that the touch metal mesh blocks the light that causes the display brightness of the display area and the under-screen camera area to be inconsistent.

Figure 1:
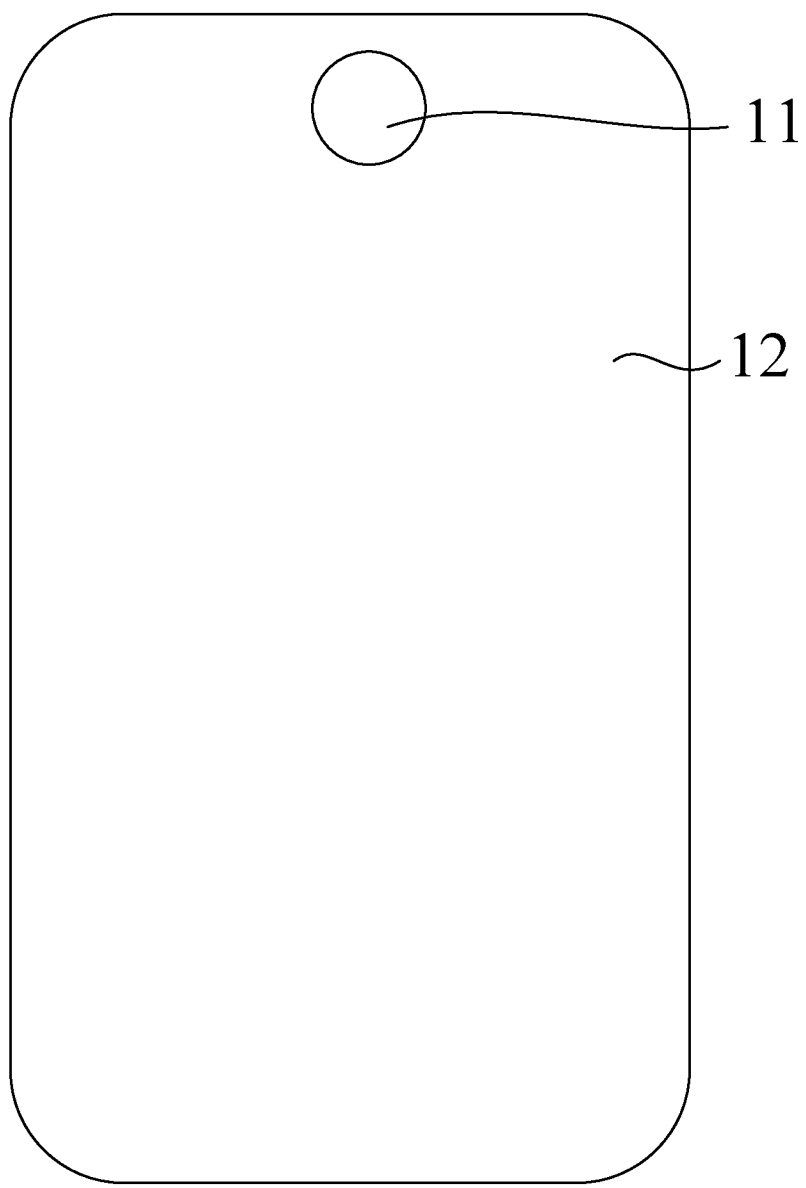
FIG. 1 is a first schematic view of an organic light-emitting diode (OLED) display device in the prior art.
Figure 2:
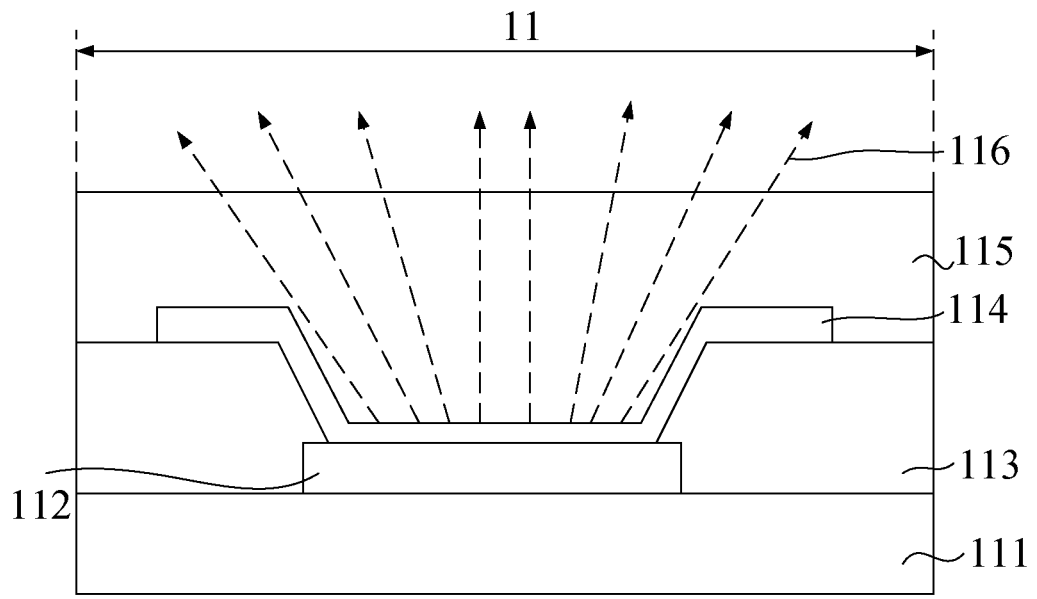
FIG. 2 is a second schematic view of the OLED display device in the prior art.
Figure 3:
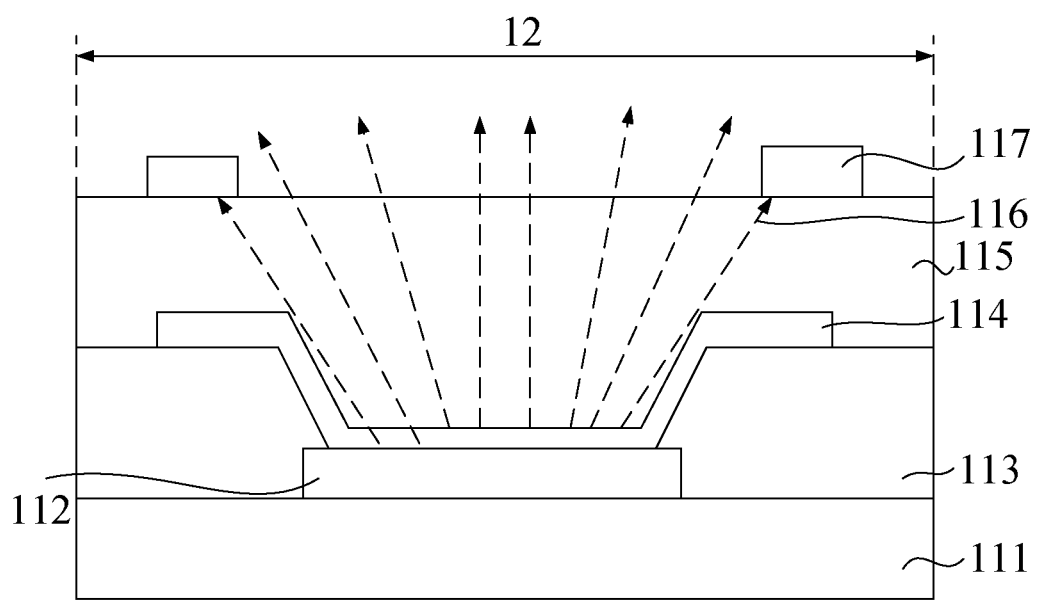
FIG. 3 is a third schematic view of the OLED display device in the prior art.

As shown in FIG. 1, FIG. 2, and FIG. 3, in order to achieve a full screen, a camera is disposed under the display panel in conventional OLED display devices. The OLED display device comprises an under-screen camera area 11 and a display area 12. The under-screen camera area 11 turns off the display function when the camera function is realized, and displays when the display function is realized, thereby realizing a full screen. At the same time, in order to achieve the thinner and lighter OLED display device, direct on cell touch (DOT) design will be carried out so that a touch metal mesh 117 is disposed on a packaging layer 115. At the same time, in order to increase the light transmittance of the under-screen camera area 11, only the touch metal mesh 117 is disposed in the display area 12. As shown in FIG. 2 and FIG. 3, the OLED display device includes an array layer 111, an anode layer 112, a pixel definition layer 113, a light-emitting function layer 114, and the packaging layer 115.

Figure 4:
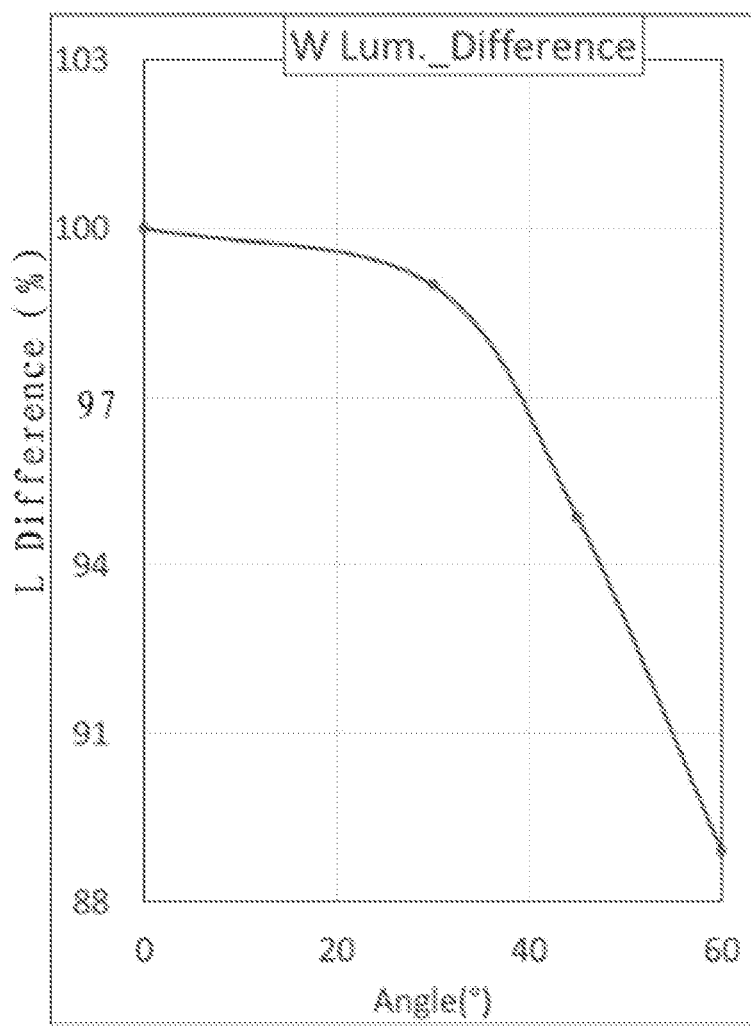
FIG. 4 is a graph showing a variation of a ratio of a brightness of a display area of the OLED display device to an under-screen camera area as a function of a viewing angle in the prior art.

The light 116 emits from the light-emitting function layer 116 of the OLED display device, but it can be seen from FIG. 3 that in the large viewing angle direction, part of the light 116 is blocked by the touch metal mesh 117, causing an intensity of the light in the under-screen camera area 11 to be greater than an intensity of the light in the display area 12, resulting in inconsistent brightness in different areas of the display panel, and at a large viewing angle, it will further increase the problem of inconsistent brightness in different areas. As shown in FIG. 4, the abscissa angle) (°) in FIG. 4 is the viewing angle, and the ordinate L difference (%) is the percentage of the brightness difference of different areas of the display panel. The curve is the ratio of the brightness of the display area to the brightness of the camera area under the screen, and the graph is W Lum.-Difference, that is, the white light brightness difference. It can be seen from FIG. 4 that as the viewing angle increases, the difference between the brightness of the display area and the brightness of the camera area under the screen is increased. When the viewing angle is 60 degrees, the brightness of the display area is nearly 12% less than the brightness of the camera area under the screen, that is, the conventional OLED display devices have a touch metal grid to block the light, resulting in a technical problem that the display brightness of the display area and the camera area under the screen is inconsistent.

Figure 5:
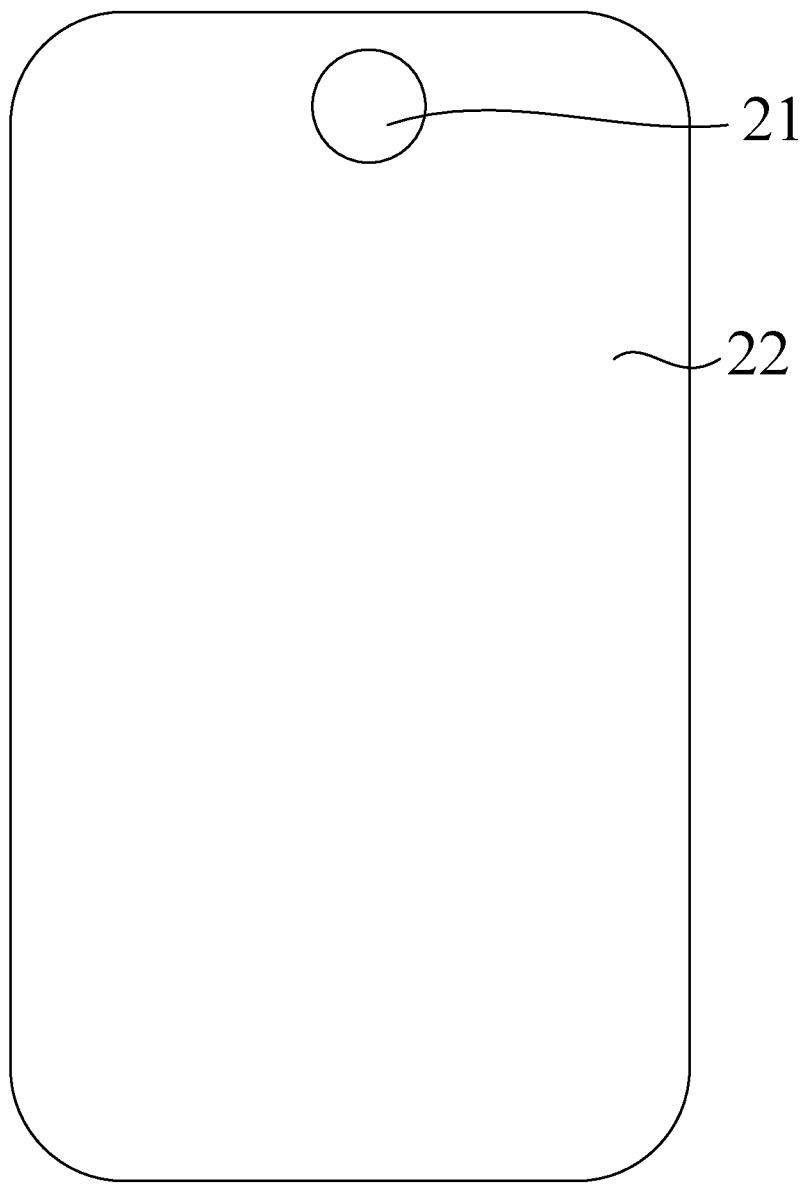
FIG. 5 is a first schematic view of an OLED display device according to an embodiment of the present invention.
Figure 6:
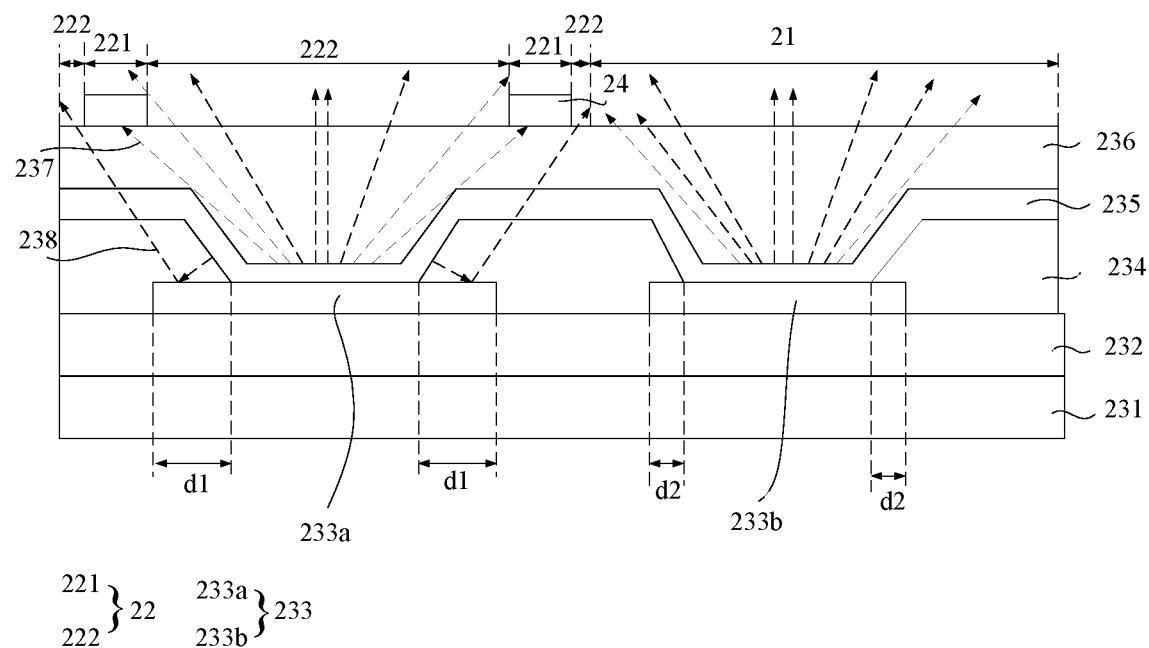
FIG. 6 is a second schematic view of the OLED display device according to an embodiment of the present invention.
Figure 7:
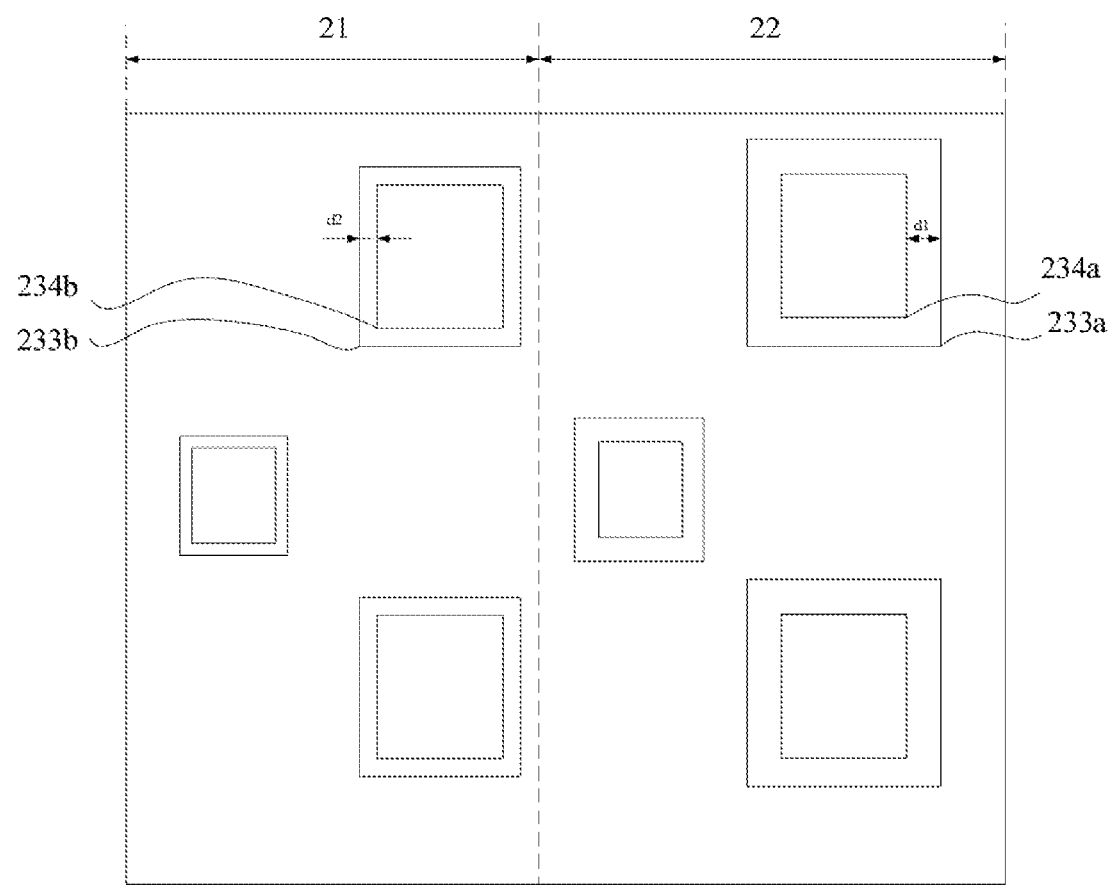
FIG. 7 is a third schematic view of the OLED display device according to an embodiment of the present invention.

As shown in FIG. 5, FIG. 6, and FIG. 7, an organic light-emitting diode (OLED) display panel provided by an embodiment of the present disclosure comprises a first display area 21 and a second display area 22. The OLED display panel comprises:
  a substrate 231;
  a driving circuit layer 232 disposed on a side of the substrate 231;
  an anode layer 233 disposed on a side of the driving circuit layer 232 away from the substrate 231, and the anode layer 233 comprises a plurality of first anodes 233b located in the first display area 21 and a plurality of second anodes 233a located in the second display area 22;
  a pixel definition layer 234 disposed on a side of the anode layer 233 away from the driving circuit layer 232, and the pixel definition layer 234 comprises a plurality of first pixel openings disposed corresponding to the first anodes 233b and a plurality of second pixel openings disposed corresponding to the second anodes 233a;
  a light-emitting function layer 235 disposed on a side of the pixel definition layer 234 away from the anode layer 233; and
  a packaging layer 236 disposed on a side of the light-emitting function layer 235 away from the pixel definition layer 234;
  wherein, a length d1 of the second anodes 233a in the second display area 22 extended from the second pixel openings is greater than a length d2 of the first anodes 233b in the first display area 21 extended from the first pixel openings.

In one embodiment, an organic light-emitting diode (OLED) display panel is provided. A length of the second anode in the second display area extended from the second pixel opening is greater than a length of the first anode in the first display area extended from the first pixel opening, so that the length of the second anode in the second display area is increased. In the second display area, when light is emitted to a portion of the second anode extended from the second pixel opening, it can be reflected to the outside of the display panel through the portion of the second anode extended from the second pixel opening. In this way, the brightness of the second display area is similar to or consistent with the brightness of the first display area, thereby preventing inconsistent display brightness of the display area and the camera area under the screen.

It should be noted that, in the embodiment of the present invention, the pixel opening defined by the pixel defining layer forms a light-emitting area, and the light-emitting function layer is disposed in the light-emitting area. For example, the light-emitting function layer is disposed in the pixel opening in FIG. 6, therefore, the pixel opening is not shown in FIG. 6.

It should be noted that, in the embodiment of the present invention, the cross-sectional shape of the pixel opening is an inverted trapezoid, so a length of the portion of the anode extended from the pixel opening refers to a length of the side of the pixel opening that contacts the anode, for example, a length of the portion of the second anode extended from the second pixel opening refers to a length of the side of the second pixel opening that contacts the second anode. That is, a distance between an edge of the bottom side of the pixel opening and an edge of the anode is a length of the portion of the anode extended from the pixel opening.

It should be noted that the first display area is an electronic component setting area. When the electronic component is working, the display function is turned off to realize the function of the electronic component. When displaying, the display function is realized. The electronic component setting area can display, so the first display area is used as an electronic component setting area.

It should be noted that, in FIG. 6, the anode layer 233 comprises a first anode 233b and a second anode 233a.

It should be noted that the red sub-pixels, green sub-pixels, and blue sub-pixels are shown in order from top to bottom in FIG. 7, and the pixel arrangement shown in FIG. 7 is a pixel arrangement, but is not limited herein. Therefore, the arrangement of the anode in the embodiment of the present invention is also suitable for other pixel arrangement.

In an embodiment, in the second display area, the lengths of the portion of the second anode extended from the second pixel opening are equal. That is, in the planar structure of the second anode, the lengths of the portion of the second anode surrounding the second pixel opening are equal. In the cross-sectional structure of the second anode, the lengths of the second anode extended from the second pixel opening are equal on both sides.

For example, in the cross-sectional structure of the second anode in FIG. 6, the length of the portion of the second anode extended from the pixel opening on both sides of the second anode is d1. By setting the length of the portion of the second anode extended from the second pixel opening to be equal, the light can be reflected in all directions of the pixel, increasing the light intensity of the second display area, and the increment of the light intensity is consistent everywhere, so as to prevent the inconsistency of the light intensity in different areas of the second display area.

In an embodiment, in the second display area, the lengths of the portion of the second anode extended from the second pixel opening are unequal. That is, in the planar structure of the second anode, the lengths of the portion of the second anode surrounding the second pixel opening are unequal. In the cross-sectional structure of the second anode, the lengths of the second anode extended from the second pixel opening are unequal on both sides. Considering that when the touch electrode is disposed, the touch electrode may not be symmetrically arranged around the second pixel opening. For example, the light shielded by the touch electrode on the left is more than the light shielded by the touch electrode on the right, and the length of the second anode surrounding the second pixel opening can be made greater in some areas than in other areas. Therefore, the light intensity of different areas is adaptively increased, the light of each area of the pixel is uniform, the light intensity of the second display area is improved, and the display unevenness is prevented.

In an embodiment, a minimum length of the portion of the second anode extended from the second pixel opening is greater than a maximum length of the first anode extended from the first pixel opening. When the lengths of the portions of the first anode and the second anode extended from the pixel opening are unequal, the minimum length of the portion of the second anode extended from the second pixel opening is greater than the maximum length of the first anode extended from the first pixel opening. That is, when the light intensity is increased by making the anode extended from the via hole, an increase in the light intensity of the second display area is always greater than an increase in the light intensity of the first display area. In this way, the light intensity of the first display area and the second display area are similar or even consistent, and the problem of uneven brightness in various areas of the display panel is prevented.

In one embodiment, an optical compensation structure is disposed on a side of the second anode away from the driving circuit layer, or the optical compensation structure is disposed on a side surface of the second anode facing the pixel definition layer. The light compensation structure is used for reflecting the light emitted to the light compensation structure to the outside of the OLED display panel. By disposing a light compensation structure on the side of the second anode away from the driving circuit layer, or by forming a light compensation structure on the surface of the second anode facing the pixel definition layer, the light compensation structure reflects the light to the outside of the OLED display panel, so as to increase the light intensity of the second display area of the OLED display panel, and light intensity of the first display area and the second display area of the OLED display panel is consistent, and the display effect of the OLED display panel is improved.

In the embodiment of the present invention, the optical compensation structure being disposed on a side of the second anode away from the driving circuit layer means that a light compensation structure is formed on the side of the second anode away from the driving circuit layer. The light compensation structure being disposed on the surface of the second anode facing the pixel definition layer means that the light compensation structure is formed on the surface of the second anode.

In one embodiment, the light compensation structure is disposed around the second pixel opening. When the light compensation structure is disposed, considering that light will be emitted from each area, and the touch electrode has a mesh shape, the light compensation structure can be disposed around the second pixel opening so that light emitted from all directions can be reflected by the light compensation structure, thereby increasing the light intensity of the second display area.

In one embodiment, when the optical compensation structure is disposed on the side surface of the second anode facing the pixel definition layer, a portion of the optical compensation structure extended from the second pixel opening is disposed in the first area, or the portion of the optical compensation structure extended from the second pixel opening extends from the first area to the second area. When the optical compensation structure is disposed, the optical compensation structure can also be obtained by processing the surface of the second anode. The light is reflected by the light compensation structure to improve the brightness of the second display area, and for different brightness requirements, the portion of the light compensation structure extended from the second pixel opening can be disposed in the first area, or the part of the light compensation structure extended from the opening of the second pixel can extend from the first area to the second area.

Figure 8:
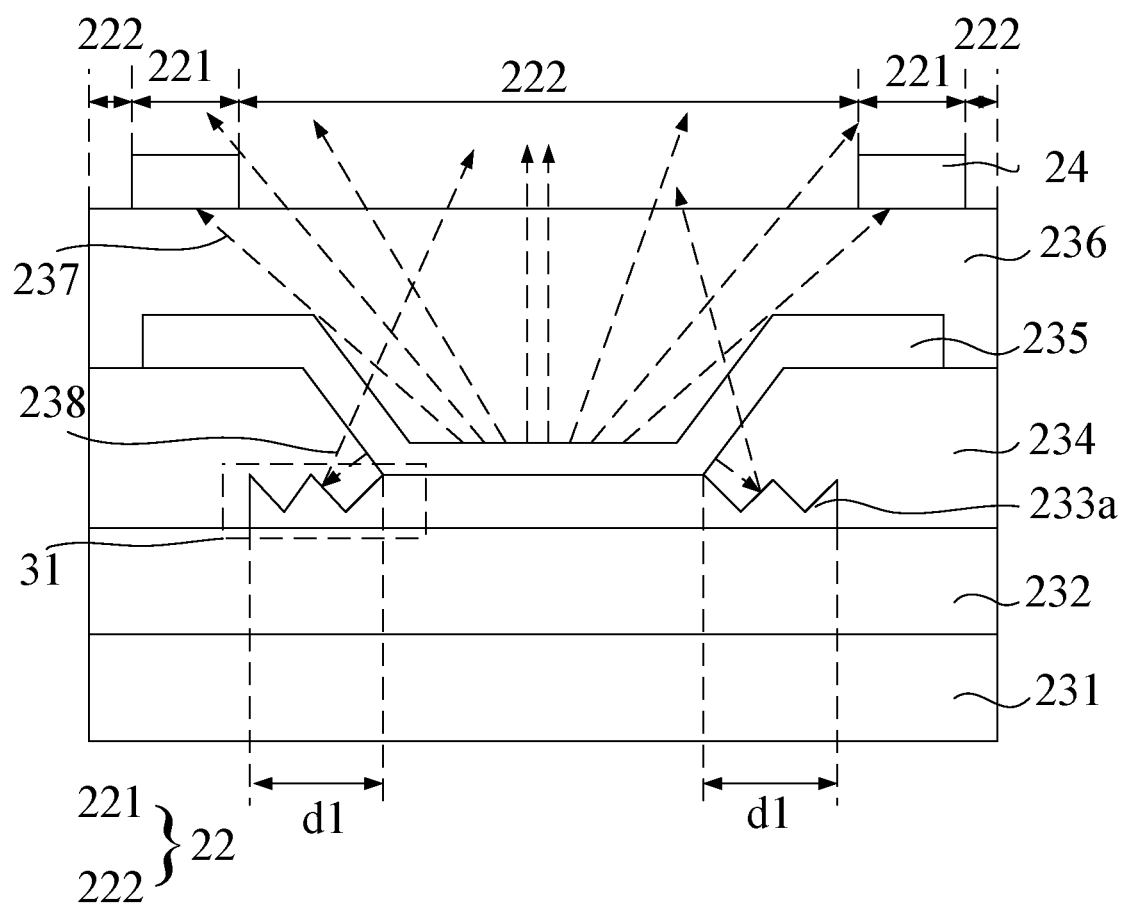
FIG. 8 is a fourth schematic view of the OLED display device according to an embodiment of the present invention.
Figure 9:
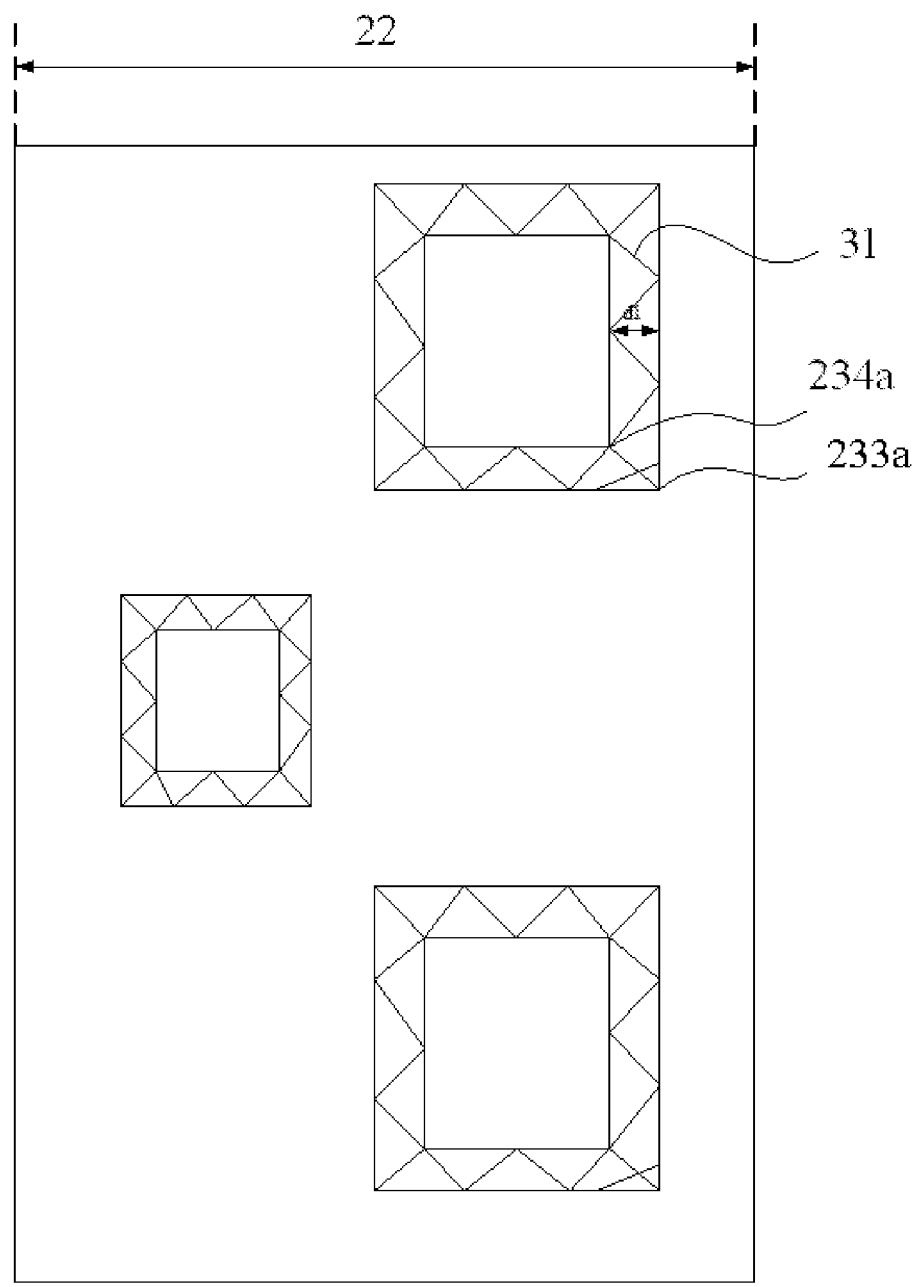
FIG. 9 is a fifth schematic view of the OLED display device according to an embodiment of the present invention.

Specifically, as shown in FIG. 8 and FIG. 9, on the side close to the pixel definition layer 234, a light compensation structure 31 is disposed on the surface of the second anode 233a. When the light compensation structure is formed on the second anode, the light compensation structure can be formed on the surface of the second anode. The improvement of the second anode can increase the light intensity of the second display area without increasing the thickness of the display panel. The light intensity of the first display area and the second display area of the OLED display panel are the same, thereby improving the display effect of the OLED display panel.

In one embodiment, the optical compensation structure comprises a saw-tooth structure, and the saw-tooth structure comprises a plurality of protrusions and grooves. When a light compensation structure is disposed on the second anode, light can be reflected by the newly saw-tooth structure, thereby increasing the light intensity of the second display area.

In one embodiment, the optical compensation structure comprises a saw-tooth structure, and the saw-tooth structure comprises a plurality of protrusions and grooves. The protrusions and grooves are formed on the surface of the second anode. When the optical compensation structure is formed on the surface of the second anode, protrusions and grooves can be formed by etching the surface of the second anode, so that the protrusions and grooves form a saw-tooth structure to reflect light and increase intensity of the light in the second display area.

In one embodiment, adjacent saw teeth of the saw-tooth structure comprise acute angles. As shown in FIG. 8, adjacent saw teeth are acute angles. The light 238 at this time is reflected from between the touch electrodes, which is different from the two touch electrodes in FIG. 6, but still compensates for the brightness of the second display area of the OLED display panel.

Therefore, the display brightness of the first display area and the second display area are consistent, and when the saw-tooth structure is disposed, the direction of the light can be controlled to prevent the light from still irradiating the touch electrode after being reflected by the light compensation structure, so as to compensate for the light in the second display area.

In one embodiment, the adjacent saw teeth of the saw-tooth structure comprise obtuse angles, that is, when the saw-tooth structure is disposed, it can also make the light be consistent with the emission direction of the light in FIG. 6, thereby increasing the brightness of the second display area, making the brightness of the first display area and the second display area consistent, and at the same time, the light intensity in different areas in the second display area is consistent, which further improves the brightness uniformity of the display panel.

In one embodiment, the adjacent saw teeth of the saw-tooth structure comprise right angles, that is, when the saw-tooth structure is disposed, the angle of the adjacent saw teeth is set to a right angle in consideration of the difference in the reflection angle of the light, so that the light can be emitted out of the OLED display panel, thereby the brightness of the second display area of the OLED display panel is increased, so that the brightness of the first display area and the second display area are consistent.

In one embodiment, the width of the saw-tooth structure disposed around the second pixel opening is not equal, that is, when the saw-tooth structure is disposed around the second pixel opening, the width of the saw-tooth structure can be different in different areas, and light emitted from different angles can be reflected at different angles.

In other embodiments of the present invention, considering that in the process of defining the pixel opening and the anode, the anode is symmetrically disposed with respect to the pixel opening, therefore, when the saw-tooth structure is disposed, the width of the saw-tooth structure around the via hole is made equal, so that the saw-tooth structure around the via hole has the same effect on improving the light intensity and prevents the problem of uneven brightness.

In one embodiment, the light compensation structure comprises a curved surface, that is, when the light compensation structure is disposed, and the light compensation structure is made as a sawtooth structure, the light compensation structure can also be a curved surface, and the light is reflected by the curved surface, so that the light is reflected to the outside of the OLED display panel, and the brightness of the second display area is increased, thereby improving the uniformity of the brightness of the display panel.

Figure 11:
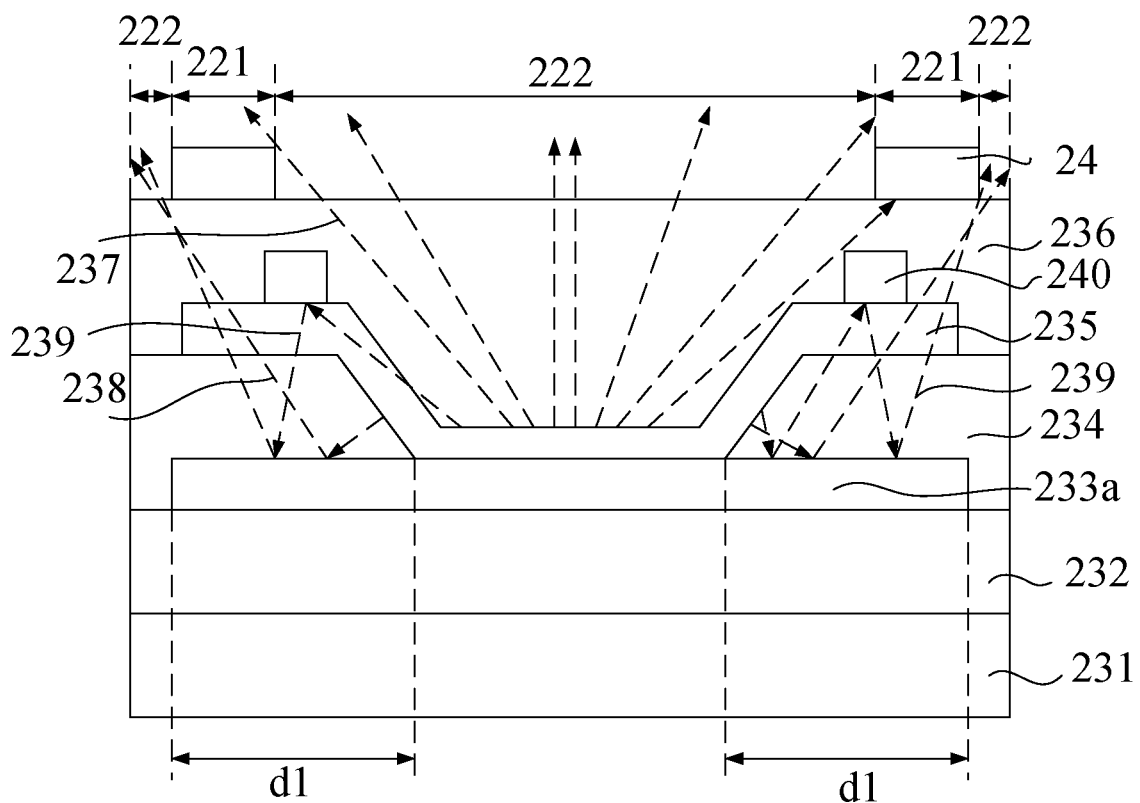
FIG. 11 is a seventh schematic view of the OLED display device according to an embodiment of the present invention.

In one embodiment, as shown in FIG. 11, the OLED display panel comprises a touch layer 24, and the touch layer 24 is disposed on a side of the packaging layer 236 away from the substrate 231. The touch layer 24 comprises a touch electrode, the touch electrode comprises a touch metal, and the touch metal is provided with a touch opening corresponding to the second pixel opening. The second display area comprises a first area 221 corresponding to the touch metal and a second area 222 corresponding to the touch opening. The portion of the second anode extended from the second pixel opening is extended from the first area 221 to the second area 222. Because the portion of the second anode extended from the second pixel opening is extended from the first area to the second area, the area of the second anode reflecting light is increased. Therefore, the light intensity of the second display area is further increased, and the brightness uniformity of the display panel is improved.

In one embodiment, the first display area is not provided with touch electrodes. According to the embodiment of the present invention, the volume of the touch electrodes in the first display area and the second display area are different, which causes the brightness of the first display area and the second display area of the display panel to be inconsistent. Therefore, for the display panel without touch electrodes in the first display area, the light intensity of the second display area is increased, so that the brightness of the first display area and the second display area are similar or consistent, and the brightness uniformity of the display panel is improved. However, the embodiments of the present invention are not limited herein. For display panels in which the volume of the touch electrodes in the first display area is less than the volume of the touch electrodes in the second display area, the embodiments of the present invention can be adopted to increase the brightness of the second display area.

In one embodiment, in the first display area, the length of the first anode extended from the first pixel opening is greater than or equal to a threshold. That is, when the first anode is disposed in the first display area, considering the light loss in the first display area, the length of the first anode in the first display area can be set to be greater than the width of the first pixel opening. As a result, the lost light is reflected by the portion of the first anode extended from the first pixel opening, thereby increasing the brightness of the first display area, and considering that when the first anode is disposed, the portion extended from the first pixel opening is disposed asymmetrically with respect to the first pixel opening, and the portion of the first anode extended from the first pixel opening can also increase the brightness of the first display area of the OLED display panel, so that the first anode extended from the first portion of the pixel opening is disposed asymmetrically with respect to the first pixel opening.

It should be noted that the threshold value is set according to the improvement effect of the light intensity of the display panel. For example, when the threshold value is 4 micrometers, the light intensity of the first display area is increased, so the threshold value can be set to 4 micrometers.

Figure 10:
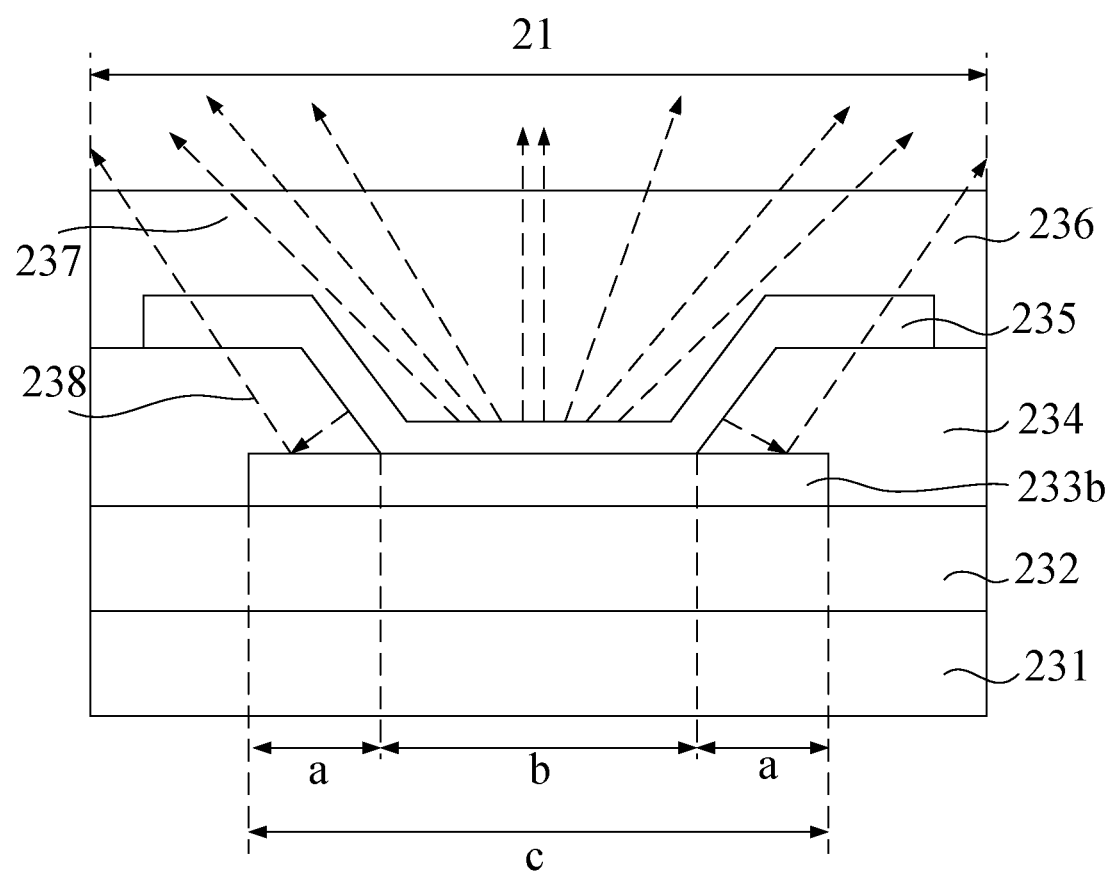
FIG. 10 is a sixth schematic view of the OLED display device according to an embodiment of the present invention.

In one embodiment, as shown in FIG. 10, in the first display area 21, the width c of at least one first anode 233*b* is greater than the width b of the first pixel opening. The portion of the first anode 233*b* extended from the first pixel opening is symmetrically disposed with respect to the first pixel opening. That is, the length of the portion of the first anode 233*b* extended from the first pixel opening is "a." By disposing the first anode of the first display area extended from the first pixel opening, the first anode extended from the area of the first pixel opening can increase the brightness of the first display area. At the same time, since the portion of the first anode extended from the first pixel opening is disposed symmetrically with respect to the first pixel opening, the brightness of the first display area of the OLED display panel can be improved, and the brightness of each area is uniform.

In one embodiment, by making the length of the portion of the first anode in the first display area extended from the first pixel opening less than the length of the portion of the second anode in the second display area extended from the second pixel opening, that is, when the width of the first anode of the first display area exceeds the width of the first pixel opening, and the width of the second anode of the second display area is greater than the width of the second pixel opening, considering the need to make the increase in brightness of the second display area greater than the increase in brightness of the first display area, so that the length of the first anode of the first display area extended from the first pixel opening is less than the length of the second anode of the second display area extended from the second pixel opening, therefore, the brightness of the first display area and the second display area are improved at the same time. Further, since the increase in the brightness of the second display area is greater than the increase in the brightness of the first display area, the brightness of the first display area and the second display area is increased. The brightness is similar or consistent, which improves the brightness uniformity of the OLED display panel.

In one embodiment, the difference between the length of the portion of the second anode in the second display area extended from the second pixel opening and the length of the portion of the first anode in the first display area extended from the first pixel opening ranges from 2 µm to 30 µm. Specifically, the difference between the portion of the second anode in the second display area extended from the second pixel opening and the length of the first anode in the first display area extended from the first pixel opening ranges from 8 µm to 12 µm.

Figure 12:
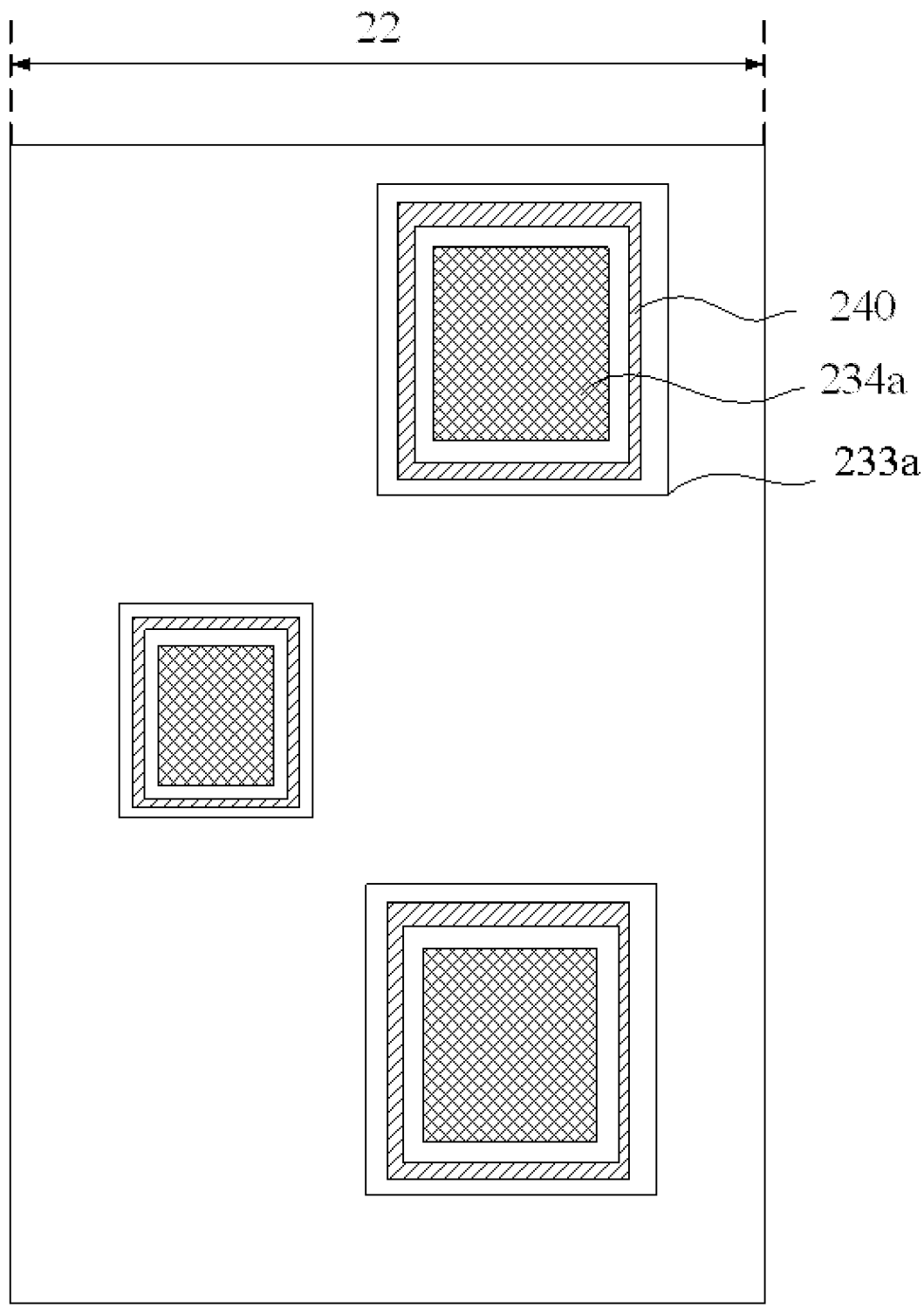
FIG. 12 is an eighth schematic view of the OLED display device according to an embodiment of the present invention.

In one embodiment, as shown in FIG. 11 and FIG. 12, the OLED display panel further comprises a reflective layer 240. The reflective layer 240 is disposed on a side of the light-emitting function layer 235 away from the anode layer 233, and the reflective layer 240 is disposed around the second pixel opening. That is, by disposing the reflective layer, the reflective layer can reflect the original light emitted to the touch metal to the second anode, and then reflect the light out of the OLED display panel through the second anode, or by reflecting the light reflected once by the second anode to the second anode again, the light is prevented from being blocked by the touch metal after the reflection of the second anode, so that the light is reflected outside the OLED display panel, and the brightness of the second display area is further improved.

It should be noted that in FIG. 9, the reflective layer is disposed in the second area and the first area, thereby increasing the amount of light that can be controlled by the reflective layer and further increasing the brightness of the second display area. However, in the embodiment of the present invention, the reflective layer may be disposed between the area corresponding to the second pixel opening and the first area, so as to prevent the reflective layer from affecting the touch function.

In one embodiment, light-emitting function layer further comprises a cathode layer, and the cathode layer is disposed on a side of the light-emitting function layer away from the pixel definition layer, and the reflective layer is disposed between the cathode layer and the pixel definition layer.

By disposing a reflective layer between the cathode layer and the pixel definition layer, when the light is reflected by the anode, there is still light that will still be emitted to the touch metal. Therefore, the reflective layer is disposed so that the light can be reflected to the anode and then reflected again, and the light is reflected to the outside of the OLED display panel, thereby improving the brightness of the second display area.

In one embodiment, the material of the reflective layer comprises metal, specifically such as copper, silver, or metal alloys. While the brightness of the second display area is improved by using the reflective layer, the reflective layer and the cathode layer are attached to each other, so that the reflective layer can simultaneously reduce the impedance of the cathode layer.

In one embodiment, the material of the anode layer comprises a stack of indium tin oxide, silver, and indium tin oxide. By using the stack to form the anode layer, the reflective ability of the pixel electrode is strong, thereby reflecting light to the outside of the OLED display panel.

It should be noted that for the specific position of the reflective layer, the width and position of the reflective layer can be designed according to the angle of light emission or reflection, so that the light reflected by the reflective layer is reflected by the anode to the outside of the display panel. The bottom surface of the layer can be designed accordingly to control the direction of light.

It should be noted that when designing the reflective layer, the reflective layer can also not increase the thickness of the OLED display panel. Specifically, considering that the reflective layer mainly reflects and will reduce the impedance of the cathode layer, the thickness of the reflective layer is low. At the same time, due to the small setting area of the reflective layer, the reflective layer can be raised from the cathode layer or the anode layer. When the packaging layer is designed, the outermost layer of the packaging layer remains flat, while the other layers of the packaging layer are processed. The corresponding design is sufficient, so that the thickness of the OLED display panel is not increased.

Figure 13:
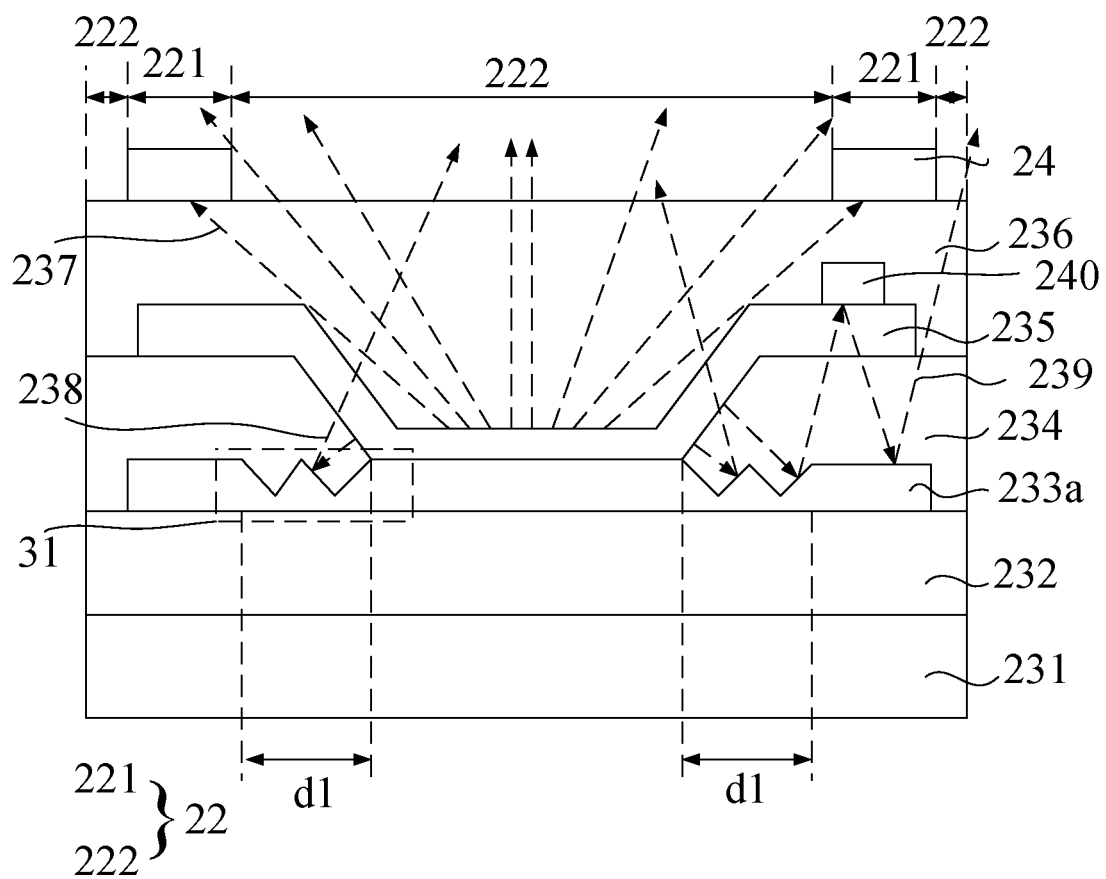
FIG. 13 is a ninth schematic view of the OLED display device according to an embodiment of the present invention.

In one embodiment, as shown in FIG. 13, a projection of the reflective layer 240 on the substrate 231 is not overlapped with a projection of the optical compensation structure 31 on the substrate 231. By disposing a reflective layer and a light compensation structure in the OLED display panel, as shown in FIG. 13, taking the light 239 as an example, after the light is irradiated on the light compensation structure 31, the light compensation structure 31 reflects the light, but the light will still be blocked by the touch metal. However, in this embodiment, a reflective layer 240 is disposed on the light-emitting function layer, so that light is reflected to the second anode 233a again, and the second anode 233a reflects the light, and the light 239 is reflected from the OLED display panel to increase brightness of the second display area.

In one embodiment, a projection of the reflective layer on the substrate overlaps with a projection of the optical compensation structure on the substrate in the first area. When disposing the reflective layer and the light compensation structure, considering that the light reflected by the light compensation structure will still be blocked by the touch metal, in this embodiment, the reflective layer is disposed in the first area, and the light compensation structure is disposed in the first area, so that when the light reflected by the light compensation structure enters the first area, the reflective layer will reflect the light. At the same time, the light passing through the reflective layer can be emitted from between the via hole and the first area through the light compensation structure to prevent the light from entering other areas and affecting the light mixing effect.

It should be noted that in FIG. 6 to FIG. 13, light 237 represents unreflected light, including light directly emitted to the outside of the OLED display panel and light blocked by the touch metal. The light 238 represents light that has been reflected once by the anode and emitted to the outside of the OLED display panel. The light 239 represents light emitted to the outside of the OLED display panel after being reflected by the anode and the reflective layer.

In an embodiment, the length of the portion of the second anode extended from the second pixel opening ranges from 3 µm to 10 µm, that is, the range of d1 is from 3 µm to 10 µm. Specifically, the length of the second anode extended from the second pixel opening is 6.2 µm, that is, when the second anode is disposed, in order to increase the intensity of light in the second display area, the length of the portion of the second anode extended from the second via hole is 6.2 μm, thereby improving the brightness of the second display area, and the brightness of the second display area is uniform.

At the same time, in one embodiment, an organic light-emitting diode (OLED) display device comprises an OLED display panel and electronic components. The OLED display panel comprises a first display area corresponding to the electronic components and a second display area, and the OLED display panel further comprises:
  a substrate;
  a driving circuit layer disposed on a side of the substrate;
  an anode layer disposed on a side of the driving circuit layer away from the substrate, and the anode layer comprises a plurality of first anodes located in the first display area and a plurality of second anodes located in the second display area;
  a pixel definition layer disposed on a side of the anode layer away from the driving circuit layer, and the pixel definition layer comprises a plurality of first pixel openings disposed corresponding to the first anodes and a plurality of second pixel openings disposed corresponding to the second anodes;
  a light-emitting function layer disposed on a side of the pixel definition layer away from the anode layer; and
  a packaging layer disposed on a side of the light-emitting function layer away from the pixel definition layer;
  wherein, a length of the second anode in the second display area extended from the second pixel opening is greater than a length of the first anode in the first display area extended from the first pixel opening.

In one embodiment, an organic light-emitting diode (OLED) display device is provided. The OLED display device comprises an OLED display panel. In the OLED display panel, a length of the second anode in the second display area extended from the second pixel opening is greater than a length of the first anode in the first display area extended from the first pixel opening, so that the length of the second anode in the second display area is increased. In the second display area, when light is emitted to a portion of the second anode extended from the second pixel opening, it can be reflected to the outside of the display panel through the portion of the second anode extended from the second pixel opening. In this way, the brightness of the second display area is similar to or consistent with the brightness of the first display area, thereby preventing inconsistent display brightness of the display area and the camera area under the screen.

It should be noted that in the drawings of the embodiments of the present invention, the touch layer 24 only shows the part corresponding to the touch electrode 24. Therefore, the touch layer and the touch electrode are indicated by the reference number 24. At the same time, the touch layer is manufactured by a DOT design method, specifically, including the arrangement of the sensing electrode and the driving electrode, and the arrangement position of the insulating layer are set according to requirements, and the embodiment of the present invention limited herein.

In one embodiment, in the OLED display device, the electronic component comprises an under-screen camera, and the under-screen camera is disposed on a side of the substrate away from the touch layer.

In one embodiment, in the OLED display device, a minimum length of a portion of the second anode extended from the second pixel opening is greater than a maximum length of the first anode extended from the first pixel opening.

In one embodiment, in the OLED display device, an optical compensation structure is disposed on a side of the second anode away from the driving circuit layer, or the optical compensation structure is disposed on a side surface of the second anode facing the pixel definition layer.

In one embodiment, in the OLED display device, the optical compensation structure is disposed around the second pixel opening.

In one embodiment, in the OLED display device, the optical compensation structure comprises a saw-tooth structure, and the saw-tooth structure comprises a plurality of protrusions and grooves.

In one embodiment, in the OLED display device, adjacent saw teeth of the saw-tooth structure comprise acute angles.

In the embodiment of the present invention, the anode is disposed extended from the pixel opening without increasing the thickness of the OLED display panel. At the same time, the anode reflects light to prevent light loss and light affecting the performance of the transistor, thereby making full use of light to increase the light intensity of the second display area while preventing light from affecting the performance of the transistor.

In the embodiment of the present invention, the brightness of the second display area is increased by extending the second anode of the second display area extended from the second pixel opening by a certain length.

Figure 14:
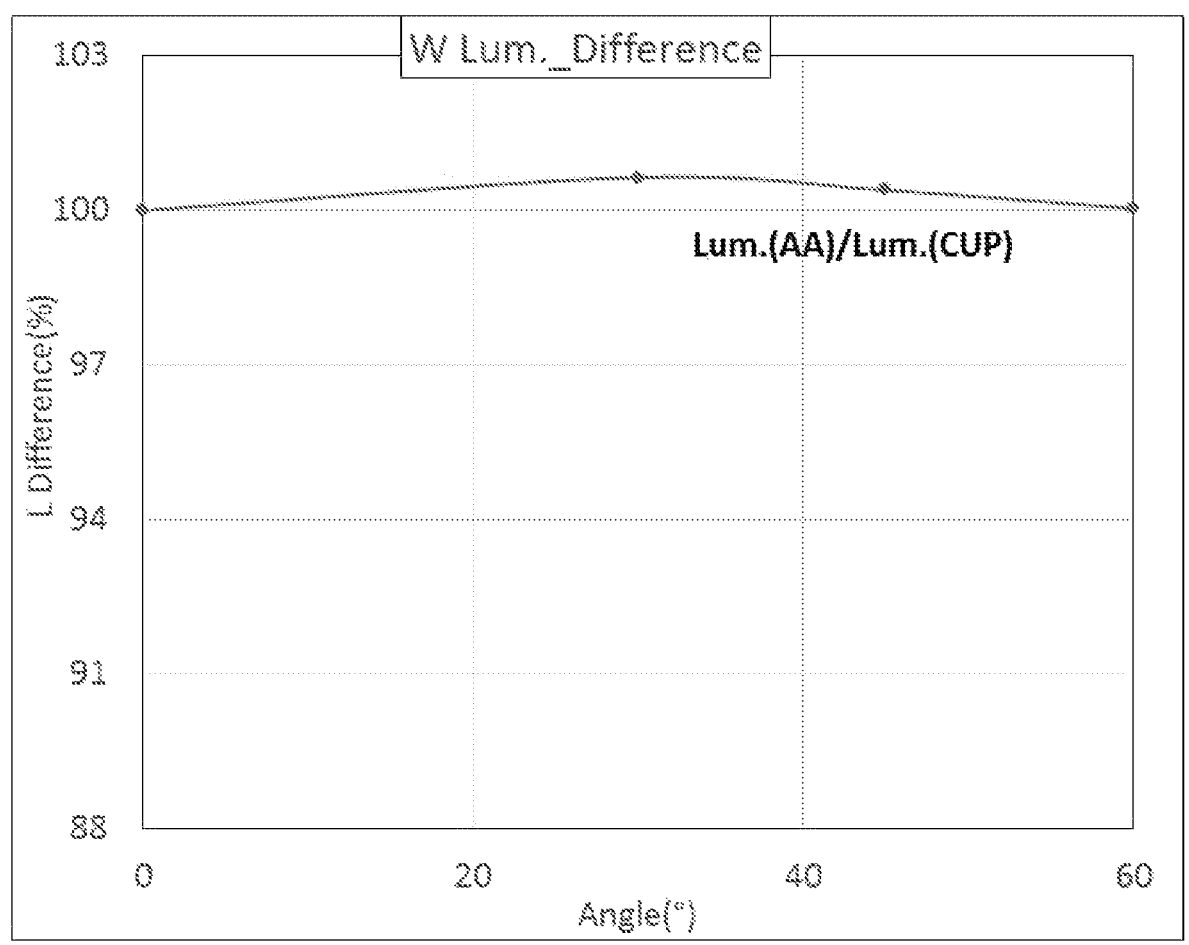
FIG. 14 is a graph showing a variation of a ratio of a brightness of a second display area to a first display area of the OLED display device according to an embodiment of the present invention as a function of a viewing angle.

Specifically as shown in FIG. 14, the abscissa angle (°) in FIG. 14 is the angle of view, the ordinate L Difference (%) is the percentage of the brightness difference of different areas of the display panel, the curve Lum. (AA)/Lum. (CUP) is the ratio of the brightness of the second display area to the brightness of the first display area, and the graph is W Lum.-Difference, that is, the white light brightness difference. It can be seen from FIG. 10 that the brightness of the second display area and the brightness of the first display area remain similar or even the same as the viewing angle changes. It can be seen from FIG. 14 that the brightness of the second display area is the same as that of the first display area. The maximum difference in brightness is about 1%, and the brightness of the second display area is greater than the brightness of the first display area. The difference in brightness will not affect the display effect. Therefore, the brightness of the first display area and the second display area are similar or even the same, so that the OLED display panel maintains brightness uniformity, and in order to further make the brightness of the first display area and the second display area the same, the pixel electrode can be further designed, so that the curve remains approximately straight or straight.

According to the above embodiment, the embodiments of the present invention provide an OLED display panel and an OLED display device. The OLED display panel comprises a first display area and a second display area. The OLED display panel comprises a substrate, a driving circuit layer, an anode layer, a pixel definition layer, a light-emitting function layer, and a packaging layer. The driving circuit layer is disposed on a side of the substrate, and the anode layer is disposed on a side of the driving circuit layer away from the substrate. The anode layer comprises a plurality of first anodes in the first display area and a plurality of second anodes in the second display area. The pixel definition layer is disposed on a side of the anode layer away from the driving circuit layer. The pixel definition layer comprises a plurality of first pixel openings disposed corresponding to the first anodes, and a plurality of second pixel openings disposed corresponding to the second anodes. The light-emitting function layer is disposed on a side of the pixel definition layer away from the anode layer. The packaging layer is disposed on a side of the light-emitting function layer away from the pixel definition layer, and a length of the second anode in the second display area extended from the second pixel opening is greater than a length of the first anode in the first display area extended from the first pixel opening. In the embodiment of the present invention, the length of the second anode in the second display area extended from the second pixel opening is greater than the length of the first anode in the first display area extended from the first pixel opening, thereby increasing the length of the second anode in the second display area. In the second display area, when light is emitted to the portion of the second anode extended from the second pixel opening, it can be reflected to the outside of the display panel through the portion of the second anode extended from the second pixel opening. In this way, the brightness of the second display area is similar to or consistent with the brightness of the first display area, thereby preventing inconsistent display brightness of the display area and the camera area under the screen.

In the above-mentioned embodiments, the description of each embodiment has its own emphasis. For parts that are not described in detail in an embodiment, reference may be made to related descriptions of other embodiments.

The above describes in detail an OLED display panel and an OLED display device provided by the embodiments of the present invention. Specific examples are used in this article to explain the principles and implementations of the present invention. The descriptions of the above embodiments are only used to help understanding The technical solutions of this invention and its core ideas; those of ordinary skill in the art should understand that: they can still modify the technical solutions described in the foregoing embodiments, or equivalently replace some of the technical features; and these modifications or replacements It does not cause the essence of the corresponding technical solutions to deviate from the scope of the technical solutions of the embodiments of the present invention.

What is claimed is:

1. An organic light-emitting diode (OLED) display panel, comprising a first display area and a second display area, wherein the OLED display panel comprises:
   a substrate;
   a driving circuit layer disposed on a side of the substrate;
   an anode layer disposed on a side of the driving circuit layer away from the substrate, wherein the anode layer comprises a plurality of first anodes located in the first display area and a plurality of second anodes located in the second display area;
   a pixel definition layer disposed on a side of the anode layer away from the driving circuit layer, wherein the pixel definition layer is continuous, and the pixel definition layer comprises a plurality of first pixel openings disposed corresponding to the first anodes and a plurality of second pixel openings disposed corresponding to the second anodes;
   a light-emitting function layer disposed on a side of the pixel definition layer away from the anode layer;
   a packaging layer disposed on a side of the light-emitting function layer away from the pixel definition layer; and
   a touch layer disposed on a side of the packaging layer away from the substrate, the touch layer comprising a touch electrode, the touch electrode comprising a touch metal, and the touch metal being provided with a touch opening corresponding to the second pixel openings;
   wherein a length of the second anodes in the second display area extended from the second pixel openings is greater than a length of the first anodes in the first display area extended from the first pixel openings; and
   in a direction perpendicular to the substrate, a height of the light-emitting functional layer is uniform.

2. The OLED display panel according to claim 1, wherein a minimum length of a portion of the second anodes extended from the second pixel openings is greater than a maximum length of the first anodes extended from the first pixel openings.

3. The OLED display panel according to claim 2, wherein an optical compensation structure is disposed on a side of the second anodes away from the driving circuit layer, or the optical compensation structure is disposed on a side surface of the second anodes facing the pixel definition layer.

4. The OLED display panel according to claim 3, wherein the optical compensation structure is disposed around the second pixel openings.

5. The OLED display panel according to claim 3, wherein the optical compensation structure comprises a saw-tooth structure, and the saw-tooth structure comprises a plurality of protrusions and grooves.

6. The OLED display panel according to claim 5, wherein adjacent saw teeth of the saw-tooth structure comprise acute angles.

7. The OLED display panel according to claim 3,
   wherein the second display area comprises a first area corresponding to the touch metal and a second area corresponding to the touch opening; and
   wherein the portion of the second anodes extended from the second pixel openings is extended from the first area to the second area.

8. The OLED display panel according to claim 7, wherein the first display area is not provided with the touch electrode.

9. The OLED display panel according to claim 7, wherein when the optical compensation structure is disposed on the side surface of the second anodes facing the pixel definition layer, a portion of the optical compensation structure extended from the second pixel openings is disposed in the first area, or the portion of the optical compensation structure extended from the second pixel openings extends from the first area to the second area.

10. The OLED display panel according to claim 7, further comprising a reflective layer, wherein the reflective layer is disposed on a side of the light-emitting function layer away from the anode layer, and the reflective layer is disposed around the second pixel openings.

11. The OLED display panel according to claim 10, further comprising a cathode layer, wherein the cathode layer is disposed on the side of the light-emitting function layer away from the pixel definition layer, and the reflective layer is disposed between the cathode layer and the pixel definition layer.

12. The OLED display panel according to claim 10, wherein a projection of the reflective layer on the substrate is not overlapped with a projection of the optical compensation structure on the substrate.

13. The OLED display panel according to claim 10, wherein a projection of the reflective layer on the substrate overlaps with a projection of the optical compensation structure on the substrate in the first area.

14. The OLED display panel according to claim 1, wherein a range of difference between a length of a portion of the second anodes in the second display area extended from the second pixel openings and a length of a portion of the first anodes in the first display area extended from the first pixel openings is from 8 μm to 12 μm.

15. An organic light-emitting diode (OLED) display device, comprising an OLED display panel and electronic components, wherein the OLED display panel comprises a first display area corresponding to the electronic components and a second display area, and the OLED display panel further comprises:
a substrate;
a driving circuit layer disposed on a side of the substrate;
an anode layer disposed on a side of the driving circuit layer away from the substrate, wherein the anode layer comprises a plurality of first anodes located in the first display area and a plurality of second anodes located in the second display area;
a pixel definition layer disposed on a side of the anode layer away from the driving circuit layer, wherein the pixel definition layer is continuous, and the pixel definition layer comprises a plurality of first pixel openings disposed corresponding to the first anodes and a plurality of second pixel openings disposed corresponding to the second anodes;
a light-emitting function layer disposed on a side of the pixel definition layer away from the anode layer; and
a packaging layer disposed on a side of the light-emitting function layer away from the pixel definition layer; and
a touch layer disposed on a side of the packaging layer away from the substrate, the touch layer comprising a touch electrode, the touch electrode comprising a touch metal, and the touch metal being provided with a touch opening corresponding to the second pixel openings;
wherein a length of the second anodes in the second display area extended from the second pixel openings is greater than a length of the first anodes in the first display area extended from the first pixel openings; and
in a direction perpendicular to the substrate, a height of the light-emitting functional layer is uniform.

16. The OLED display device according to claim 15, wherein a minimum length of a portion of the second anodes extended from the second pixel openings is greater than a maximum length of the first anodes extended from the first pixel openings.

17. The OLED display device according to claim 16, wherein an optical compensation structure is disposed on a side of the second anodes away from the driving circuit layer, or the optical compensation structure is disposed on a side surface of the second anodes facing the pixel definition layer.

18. The OLED display device according to claim 17, wherein the optical compensation structure is disposed around the second pixel openings.

19. The OLED display device according to claim 17, wherein the optical compensation structure comprises a saw-tooth structure, and the saw-tooth structure comprises a plurality of protrusions and grooves.

20. The OLED display device according to claim 19, wherein adjacent saw teeth of the saw-tooth structure comprise acute angles.

* * * * *